United States Patent
Li et al.

(10) Patent No.: US 12,322,747 B2
(45) Date of Patent: Jun. 3, 2025

(54) LIGHT EMITTING DIODE DEVICE, METHOD FOR MANUFACTURING THE SAME AND A DISPLAY INCLUDING THE SAME

(71) Applicant: QUANZHOU SANAN SEMICONDUCTOR TECHNOLOGY CO., LTD., Nanan (CN)

(72) Inventors: Xinglong Li, Xiamen (CN); Chen-Ke Hsu, Xiamen (CN); Junpeng Shi, Xiamen (CN); Weng-Tack Wong, Xiamen (CN)

(73) Assignee: QUANZHOU SANAN SEMICONDUCTOR TECHNOLOGY CO., LTD., Nanan (CN)

( * ) Notice: Subject to any disclaimer, the term of this patent is extended or adjusted under 35 U.S.C. 154(b) by 552 days.

(21) Appl. No.: 17/669,743

(22) Filed: Feb. 11, 2022

(65) Prior Publication Data
US 2022/0165922 A1     May 26, 2022

Related U.S. Application Data

(63) Continuation-in-part of application No. PCT/CN2020/098498, filed on Jun. 28, 2020.

(30) Foreign Application Priority Data

Aug. 12, 2019   (CN) .......................... 201910738265.4

(51) Int. Cl.
H01L 33/58     (2010.01)
H01L 25/075    (2006.01)
(Continued)

(52) U.S. Cl.
CPC .......... H01L 33/58 (2013.01); H01L 25/0753 (2013.01); H01L 33/56 (2013.01);
(Continued)

(58) Field of Classification Search
CPC ......... H01L 33/58; H01L 33/56; H01L 33/62; H01L 2933/0091
See application file for complete search history.

(56) References Cited

U.S. PATENT DOCUMENTS

2006/0261365 A1* 11/2006 Hsu ..................... H01L 25/0753
                                             257/E25.02
2007/0268694 A1* 11/2007 Bailey ..................... H01L 33/54
                                             257/E33.073
(Continued)

FOREIGN PATENT DOCUMENTS

CN       102543981 A      7/2012
CN       104009142 A      8/2014

OTHER PUBLICATIONS

Search Report issued to PCT application No. PCT/CN2020/098498 on Oct. 9, 2020.

*Primary Examiner* — Shih Tsun A Chou
(74) *Attorney, Agent, or Firm* — MUNCY, GEISSLER, OLDS & LOWE, P.C.

(57) ABSTRACT

A light emitting diode (LED) device includes at least three LED chips spaced apart from one another, an encapsulation layer and a lens. Each of the LED chips is configured to emit light having a respective one of wavelengths. The LED chips cooperate to have a light emitting region. Each LED chip has a first surface, a second surface opposite to the first surface, and a lateral surface that interconnects the first and second surfaces. The encapsulation layer covers the lateral surface of each of the LED chips, and fills gaps between the LED chips. The lens is disposed on the first surface of each of the (Continued)

LED chips, and covers the light emitting region of the LED chips.

19 Claims, 9 Drawing Sheets

(51) Int. Cl.
   *H01L 33/56* (2010.01)
   *H01L 33/62* (2010.01)
(52) U.S. Cl.
   CPC ........ *H01L 33/62* (2013.01); *H01L 2933/005* (2013.01); *H01L 2933/0058* (2013.01); *H01L 2933/0066* (2013.01); *H01L 2933/0091* (2013.01)

(56) References Cited

U.S. PATENT DOCUMENTS

| | | | | |
|---|---|---|---|---|
| 2010/0066943 | A1* | 3/2010 | Akiba | G02B 6/0073 349/68 |
| 2016/0293811 | A1* | 10/2016 | Hussell | H01L 33/60 |
| 2018/0159000 | A1* | 6/2018 | Doi | H01L 33/56 |

* cited by examiner

LIGHT EMITTING DIODE DEVICE, METHOD FOR MANUFACTURING THE SAME AND A DISPLAY INCLUDING THE SAME

CROSS-REFERENCE TO RELATED APPLICATION

This application is a bypass continuation-in-part (CIP) application of PCT International Application No. PCT/CN2020/098498, filed on Jun. 28, 2020, which claims priority of Chinese Invention Patent Application No. 201910738265.4, filed on Aug. 12, 2019. The entire content of each of the International and Chinese patent applications is incorporated herein by reference.

FIELD

The disclosure relates to a light emitting diode device and a manufacturing method thereof.

BACKGROUND

Packaging of LED chips not only provides effective mechanical protection to the LED chips but also improved heat dissipation, light emitting efficiency and light distribution of the LED chips. Therefore, the structure for packaging the LED chips plays a critical role which might affect the properties of display devices or lighting devices.

A conventional display device adopts lead-type packaging which is only suitable for instrumental display panels or indicators having relatively smaller current (e.g., 20 mA to 30 mA) and relatively smaller power (e.g., less than 0.1 W). Although lead-type packaged LED chips might also be integrated and assembled into a display device with a large size (such as display monitor), such large display device may exhibit high packaging thermal resistance (usually higher than 100 K/W), poor heat dissipation, and short service life, which would result in poor reliability and low integration, thereby being not capable of achieving color display and satisfactory display function, particularly when used as outdoor traffic signal indicators.

In addition, when LEDs are applied in traffic display, advertising display and other applications, in order to increase utilization efficiency of light energy and to avoid emission of light onto undesirable area (such as roads), the LEDs are often designed to emit light at a relatively narrow light emitting angle, and to provide an illuminated area with a horizontal dimension greater than a vertical dimension. However, challenges in current LED packaging techniques is that, during a die bonding process, a distance between every two adjacent ones of LED chips that are mounted onto a packaging substrate might be varied with a deviation of ±5 μm, or even ±15 μm due to limitation of the die bonding machine. In addition, solidification of a die-attach adhesive (for face-up packaging) or reflow thereof (for flip-chip packaging) also accounts for position deviation of the LED chips. Thus, the LED chips are usually arranged to be spaced apart from each other by a distance not less than 50 μm, and even not less than 50 μm. In such case, when a lens is disposed on the LED chips (such as R/G/B chips) for narrowing the light emitting angle, the light emitting center of the R/G/B chips is difficult to be coincident with an optical axis of the lens, which might lead to a great difference in the light emitting angle of each of the LED chips.

There is still a need to develop a more reliable LED packaging that enables specific light distribution and RGB display.

SUMMARY

Therefore, an object of the disclosure is to provide a light emitting diode (LED) device and a manufacturing method thereof that can alleviate at least one of the drawbacks of the prior art.

According to the disclosure, the LED device includes at least three LED chips, an encapsulation layer and a lens. The at least three LED chips are spaced apart from one another, and each of the LED chips are configured to emit light having a respective one of wavelengths. The LED chips cooperate to have a light emitting region. Each of the LED chips has a first surface, a second surface opposite to the first surface, and a lateral surface that interconnects the first surface and second surface. The encapsulation layer covers the lateral surface of each of the LED chips, and fills gaps between the LED chips. The lens is disposed on the first surface of each of the LED chips, and covers the light emitting region of the LED chips.

According to this disclosure, the method for manufacturing a LED device includes the steps of:
(a) providing at least three LED chips, each of the LED chips having a first surface, a second surface opposite to the first surface, and a lateral surface that interconnects the first surface and the second surface, each of the LED chips including a pair of LED electrodes disposed on the second surface;
(b) attaching the LED chips onto an adhesive tape in a spaced apart relationship, such that the second surface of each of the LED chips is disposed away from the adhesive tape;
(c) forming an encapsulation layer to cover the lateral surface of each of the LED chips and to fill gaps between the LED chips, a surface of each of the LED electrodes being exposed from the encapsulation layer;
(d) forming a circuit layer on the exposed surface of each of the LED electrodes to be electrically connected to the LED electrodes of each of the LED chips;
(e) removing the adhesive tape; and
(f) forming a lens on the first surface of each of the LED chips.

According to the disclosure, a display including at least one the abovementioned LED device is also disclosed.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
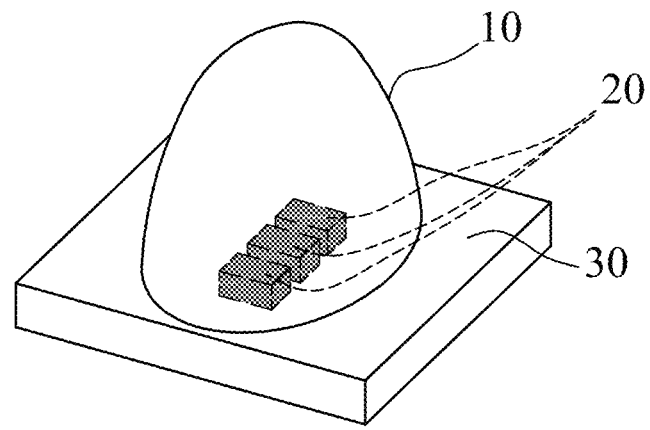
FIG. 1 is a perspective view illustrating a first embodiment of a light emitting diode (LED) device according to the disclosure.
Figure 2:
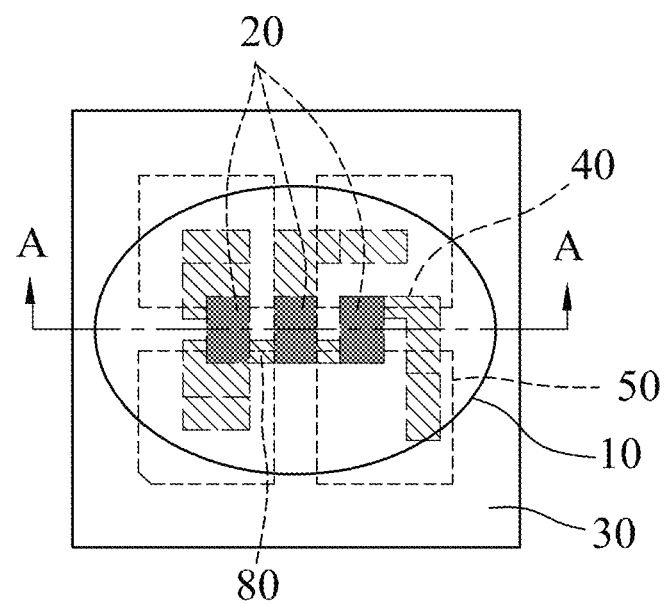
FIG. 2 is a top perspective view illustrating the first embodiment of the LED device according to the disclosure.
Figure 3:
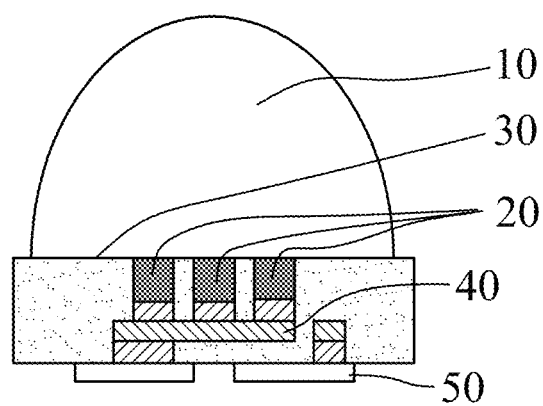
FIG. 3 is a cross-sectional view taken along line A-A in FIG. 2, illustrating the first embodiment of the LED device according to the disclosure.
Figure 4:
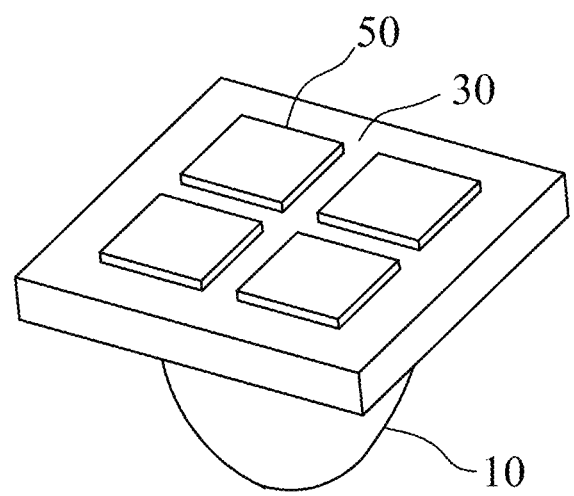
FIG. 4 is a bottom view illustrating the first embodiment of the LED device according to the disclosure.
Figure 5:
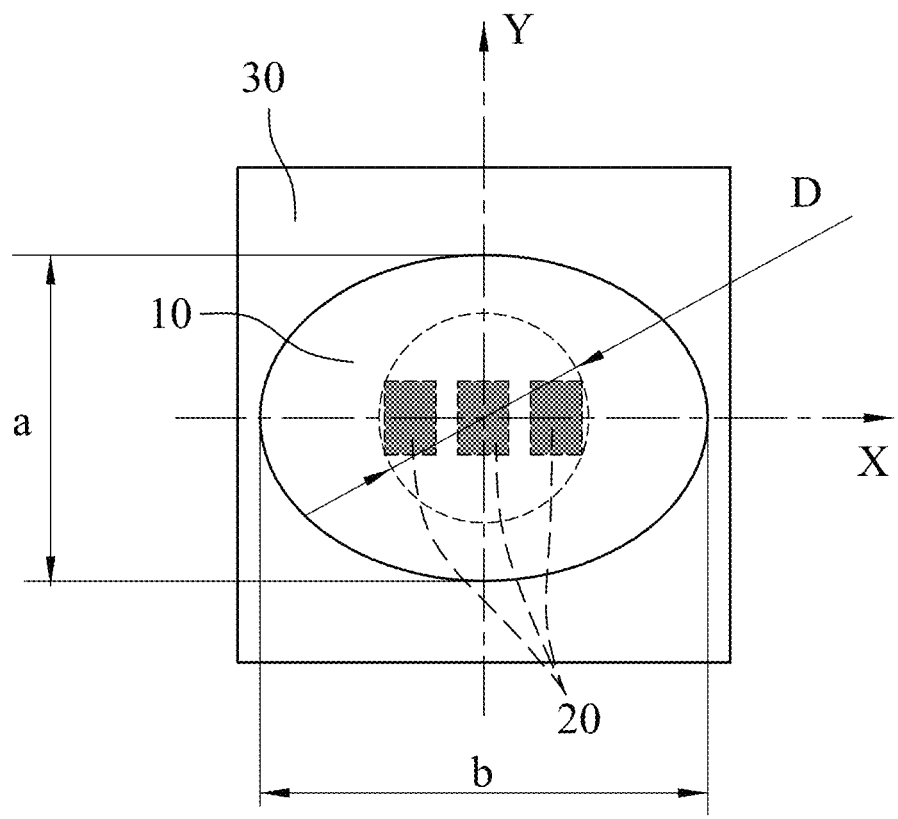
FIG. 5 is a schematic view illustrating relative position of a lens and an encapsulation layer, and a light emitting region of the first embodiment of the LED device according to the disclosure.
Figure 6:
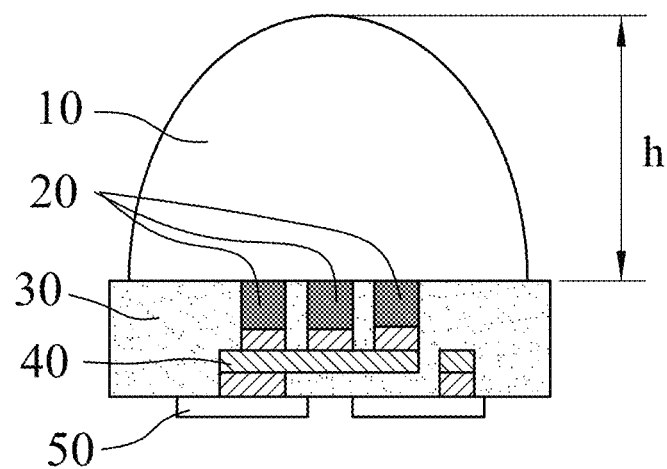
FIG. 6 is a cross-sectional view similar to FIG. 3, illustrating a height of the lens of the first embodiment of the LED device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIGS. 1 to 6, a first embodiment of a light emitting diode (LED) device according to the disclosure includes at least three LED chips 20, an encapsulation layer 30, a lens 10, a circuit layer 40 and an electrode 50.

The LED chips 20 are spaced apart from one another. A distance between two immediately adjacent ones of the LED chips 20 may be not greater than 50 μm, such as 40 μm, 30 μm, 20 μm, 10 μm, or 5 μm. The LED chips 20 may be arranged in a straight line to facilitate production of the LED device. The LED chips 20 may cooperate to have a light emitting region that has a diameter (D) not greater than 1 mm (see FIG. 5). In this embodiment, each of the LED chips 20 is a mini LED having a size that is not greater than 380 μm×380 μm. In certain embodiments, each of the LED chips 20 may be a micro LED having a size not greater than 100 μm×100 μm. In such case, more than three LED chips 20 may be included in the LED device, as long as the diameter (D) of the light emitting region of the LED chips is controlled to be not greater than 1 mm.

Each of the LED chips 20 are configured to emit light having a respective one of wavelengths. In this embodiment, the LED chips 20 are configured to emit red light, green light and blue light, respectively.

Each of the LED chips 20 has a first surface, a second surface opposite to the first surface, and a lateral surface that interconnects the first surface and the second surface. Each of the LED chips 20 may also include a pair of LED electrodes (i.e., an LED cathode and an LED anode) that are disposed on the second surface.

The encapsulation layer 30 covers the lateral surface of each of the LED chips 20, and fills gaps between the LED chips 20. In this embodiment, the LED chips 20 are directly held in position by the encapsulation layer 30 without being mounted onto a packaging substrate through a die bonding adhesive. Therefore, production efficiency may be increased, and the manufacturing cost may be greatly reduced. In addition, a distance between every two immediately adjacent LED chips 20 may be further reduced to, e.g., not greater than 30 μm, so as to improve consistency of light emitting angle of light emitted by each of the LED chips 20.

In certain embodiments, an amount of light passing through the encapsulation layer 30 accounts for less than 30% of a total amount of light emitted by the LED chips 20. In other words, more than 70% of the total amount of light may pass through the first surfaces of the LED chips 20, and light emitting efficiency of the LED device may be increased.

The encapsulation layer 30 may be made from a material that has a light transmittance not greater than 30% so as to reduce leakage of light from the encapsulation layer 30 to illuminate non-desirable area. Examples of the material suitable for making the encapsulation layer 30 may include, but are not limited to, colored silica gel and colored silicone resin. In other embodiments, a material with lower light transmittance, such as 20%, 10% or even 0% of may be adopted so as to further prevent leakage of light from the encapsulation layer 30. There is no special limitation on the color of the material. In certain embodiments, the encapsulation layer 30 may be made of a black, or dark-colored material, so as to increase contrast ratio of the LED device. In this embodiment, the encapsulation layer 30 is made of a black-colored material, or dark-colored material that has a light transmittance of 20%.

The lens 10 is disposed on the first surface of each of the LED chips 20, and covers the light emitting region of the LED chips 20. The lens 10 may be a one-step packaging convex lens, and may have one protruded surface protruding away from the LED chips 20 and serving as a light-exiting surface of the LED device. The shape of the lens 10 may be adjusted depending on desired light distribution. That is, the lens 10 may be designed to allow the LED device to provide a specific light distribution (e.g., only desired region is illuminated), so as to improve light utilization efficiency, and to reduce light energy waste.

In this embodiment, the lens 10 is in a semi-ellipsoid shape. A contact surface between the lens 10 and the encapsulation layer 30 is in an approximately ellipse shape which has a minor axis with a length of (a) (along a direction Y) and a major axis with a length of (b) (along a direction X perpendicular to the direction Y) (see FIG. 5). A half-value angle of the LED device along the minor axis (the direction Y) is $\alpha$, and a half-value angle of the LED device along the major axis (the direction X) is $\beta$, wherein $\alpha<\beta$ (i.e., the half-value angle along the direction X is different from that along the direction Y). In such case, the LED device of this disclosure may provide an illuminated area with a horizontal dimension greater than a vertical dimension. In certain embodiments, $20°\leq\alpha\leq70°$. For example, the half-value angle $\alpha$ may be 25°, 30°, 50°, 60° or 65°. In certain embodiments, the half-value angle $\alpha$ may range from 30° to 50°, such as 35°, 40° or 45°.

To further control each of the LED chips 20 emitting light at a narrower light emitting angle, a ratio of (a) to (b) may range from 0.4 to 0.9 (e.g., 0.65, 0.7, 0.75, 0.8, 0.85), and (a)≥1.5D. The lens 10 may have a height (h) that is greater than 0.5 (a). In certain embodiments, an optical axis of the lens 10 is coincident with a centroid of the light emitting region, so as to minimize the difference of the light emitting angle between each of the LED chips 20, and to improve light distribution of the LED device.

In this embodiment, the lens 10 is made from silica gel or resin, such as thermosetting silica gel, or epoxy resin by e.g., an injection molding process (will be described further hereinafter).

The circuit layer 40 is disposed on the second surface of each of the LED chips 20 to be electrically connected to the LED chips 20, and is surrounded by the encapsulation layer 30. In certain embodiments, the circuit layer 40 is disposed within and electrically isolated by the encapsulation layer 30.

In certain embodiments, the LED device further comprises a lead-out structure 80 that includes a shared lead-out electrode and a plurality of non-shared lead out electrodes (not shown in figures). The shared lead-out electrode is configured to lead out the LED cathode of each of the LED chips 20 or that is configured to lead out the LED anode of each of the LED chips 20. Each of the non-shared lead out electrodes is configured to lead out the remaining LED anode (or LED cathode) of a respective one of the LED chips 20. Such lead-out structure 80 is capable of independently controlling the LED chips 20.

The electrode 50 is disposed on the encapsulation layer 30 opposite to the lens 10, and is electrically connected to the circuit layer 40. For simplifying installation, the electrode 50 may be a surface-mount electrode capable of being welded.

Figure 7:
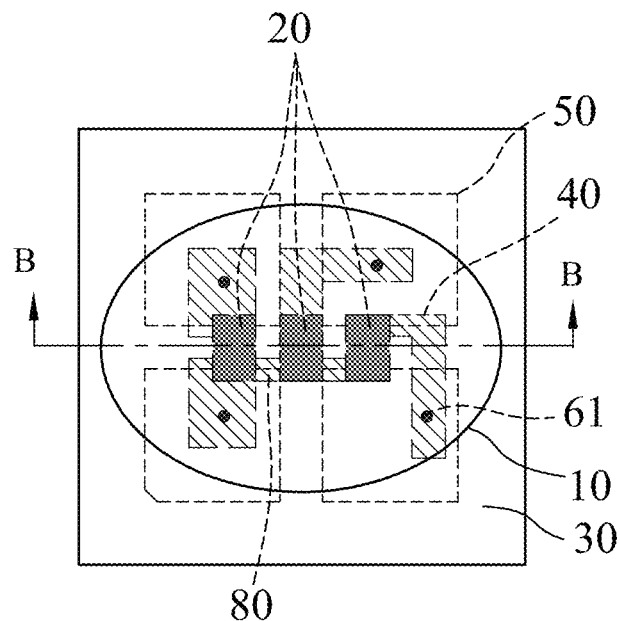
FIG. 7 is a top perspective view illustrating a second embodiment of the LED device according to the disclosure.
Figure 8:
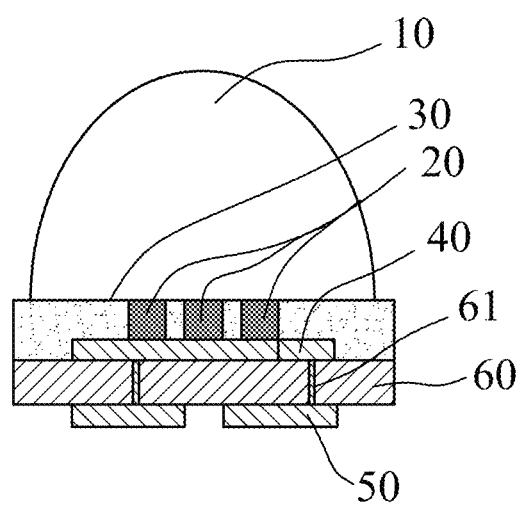
FIG. 8 is a cross-sectional view taken along line B-B in FIG. 7, illustrating the second embodiment of the LED device according to the disclosure.
Figure 9:
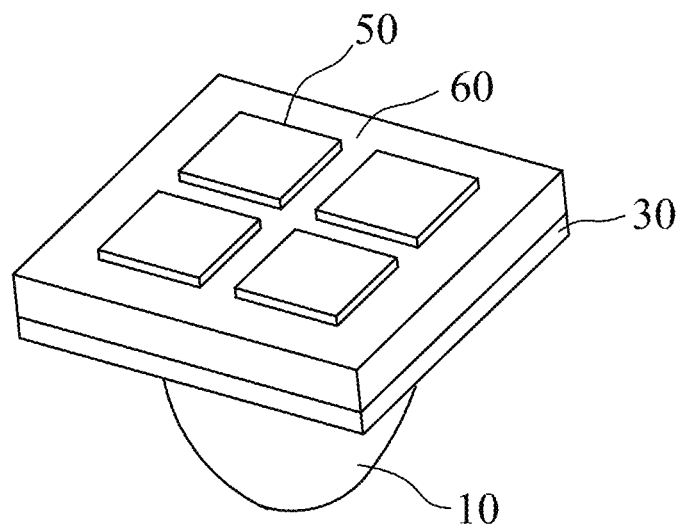
FIG. 9 is a bottom view illustrating the second embodiment of the LED device according to the disclosure.
Figure 10:
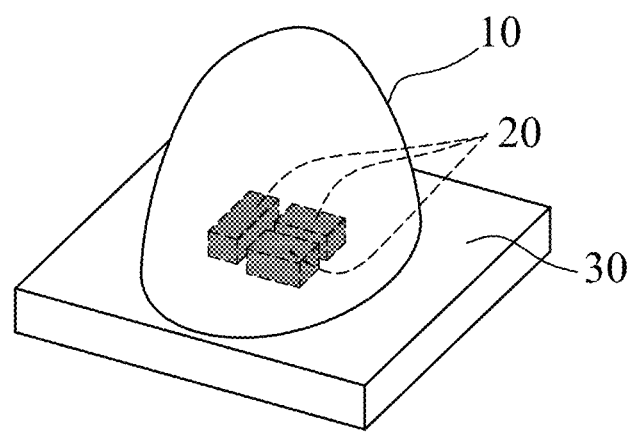
FIG. 10 is a perspective view illustrating a third embodiment of the LED device according to the disclosure.

Referring to FIGS. 7 to 9, a second embodiment of the LED device is generally similar to the first embodiment, except that in the second embodiment, the LED device further includes a supporting member 60 that is disposed between the encapsulation layer 30 and the electrode 50. The supporting member 60 has a via 61, and the circuit layer 40 is electrically connected to the electrode 50 through the via 61. The supporting member 60 is configured to provide a further mechanical support to the encapsulation layer 30, so as to avoid deformation of the encapsulation layer 30 under a high temperature.

Referring to FIGS. 10 to 14, a third embodiment of the LED device is generally similar to the first embodiment, except that the LED chips 20 in the third embodiment are arranged in a triangular pattern. Such configuration allows a more compact arrangement of the LED chips 20, which is favorable for mixing of light emitted from the LED chips 20.

Figure 15:
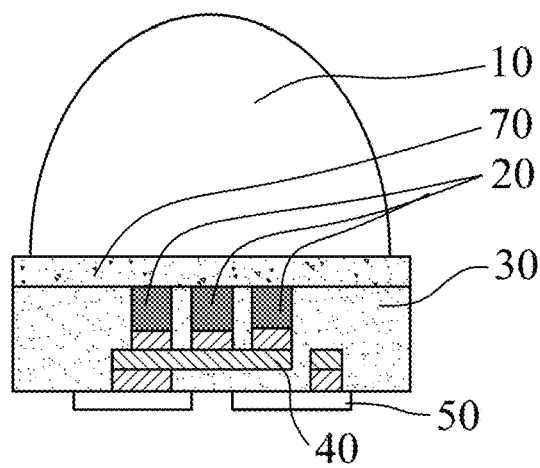
FIG. 15 is a cross-sectional view illustrating a fourth embodiment of the LED device according to the disclosure.

Referring to FIG. 15, a fourth embodiment of the LED device is generally similar to the first embodiment, except that in the fourth embodiment, the LED device further includes a light-scattering layer 70 that is disposed between the lens 10 and the LED chips 20. The light-scattering layer 70 may be made from light-transmissive silica gel or light-transmissive resin, and includes a plurality of light-scattering particles distributed in the light-transmissive silica gel or light-transmissive resin. The light-scattering particles may be silicon dioxide ($SiO_2$) particles, titanium dioxide ($TiO_2$) particles, or a mixture thereof. The light-scattering layer 70 is configured to improve uniformity of light emitting from the LED chips 20.

Figure 16:
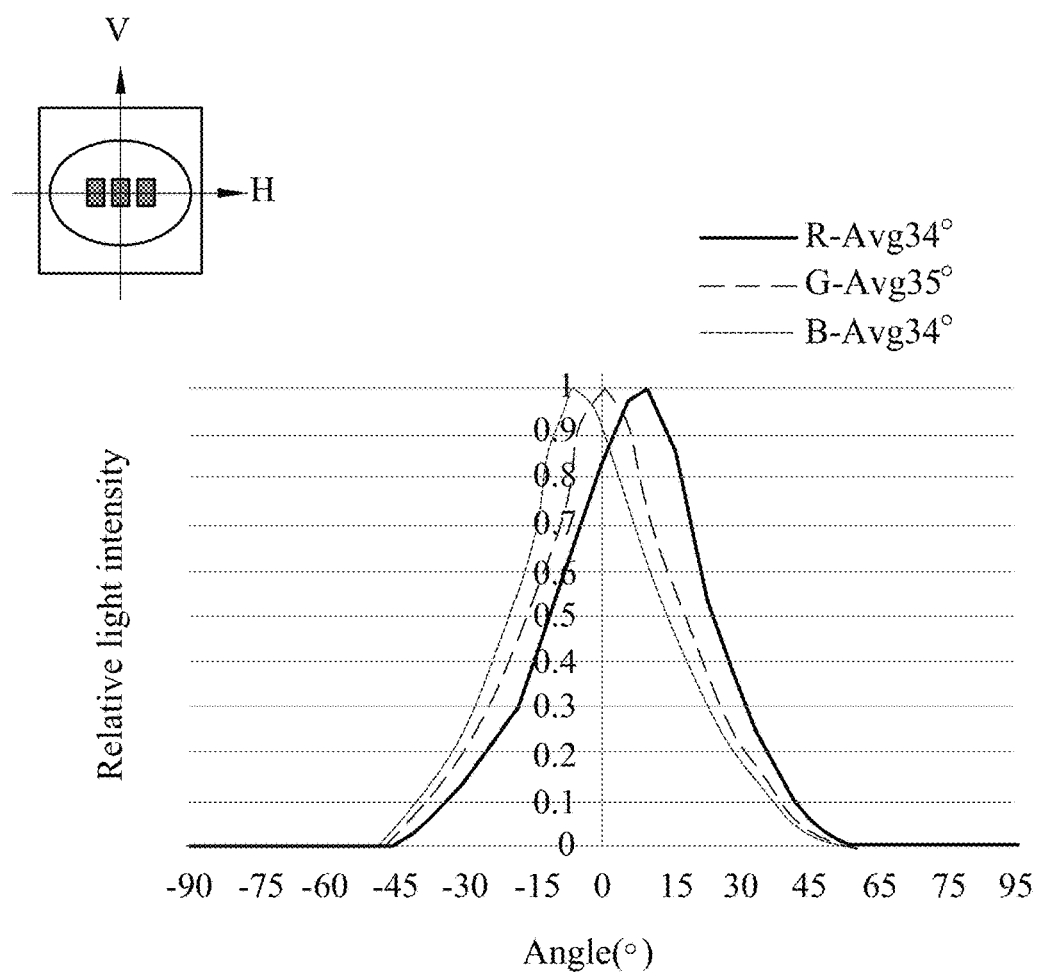
FIG. 16 is a relative light intensity distribution curve of the fourth embodiment of the LED device according to the disclosure in a vertical direction.
Figure 17:
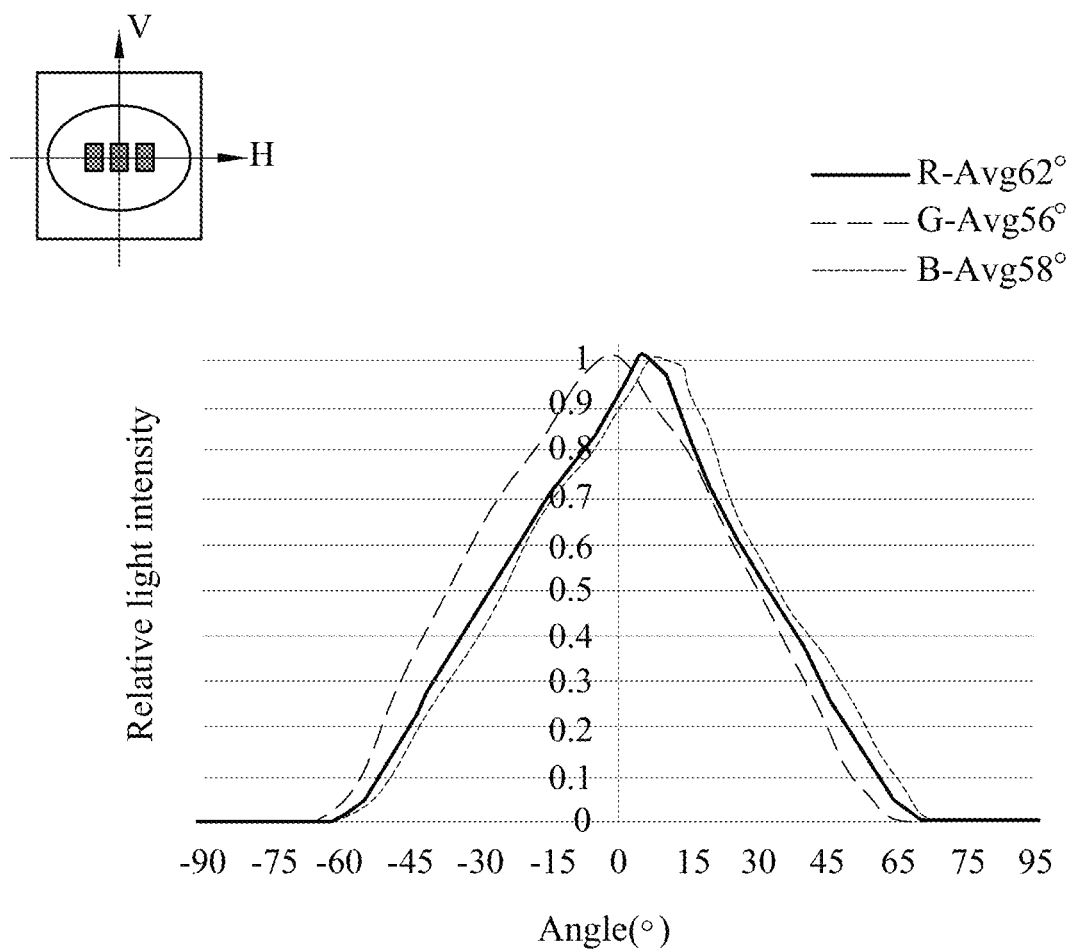
FIG. 17 is a relative light intensity distribution curve of the fourth embodiment of the LED device according to the disclosure in a horizontal direction.

With the abovementioned configuration, the LED device of this disclosure is capable of emitting light with increased uniformity, and at a relatively narrower light emitting angle thereby increasing light intensity. FIGS. 16 and 17 show respectively an angular light intensity distribution of the fourth embodiment of the LED device in a vertical direction (V) and in a horizontal direction (H). It can be seen that the angular light intensity distribution of the fourth embodiment in a horizontal direction is wider than that in a vertical direction. Such LED device is suitable for application in a monitor to achieve a desired viewing angle for viewers, that is, a relatively wider horizontal viewing angle and a relatively narrower vertical viewing angle.

Figure 11:
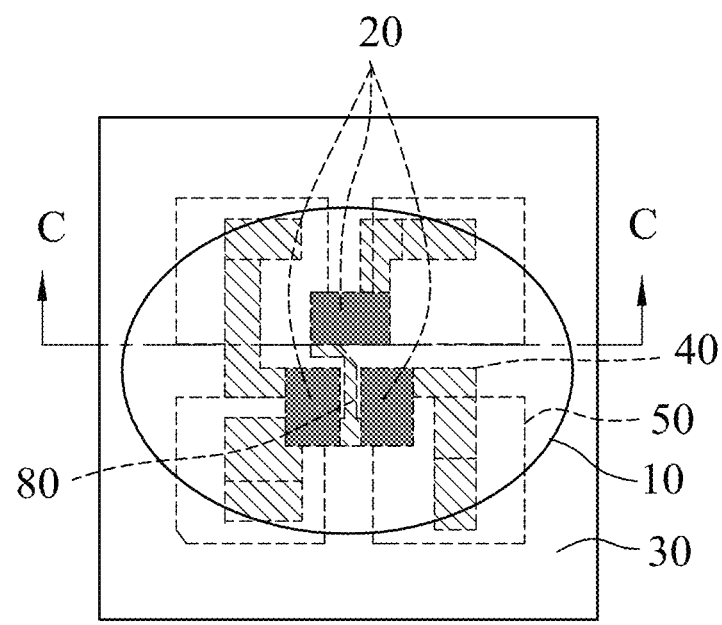
FIG. 11 is a top perspective view illustrating the third embodiment of the LED device according to the disclosure.
Figure 12:
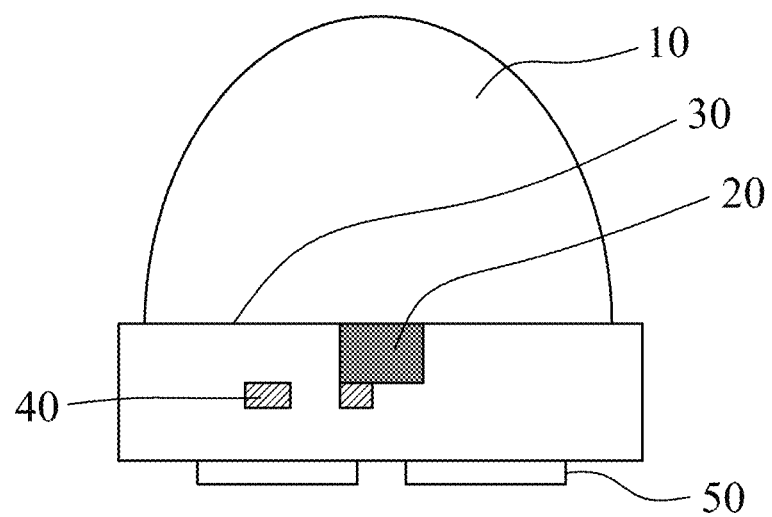
FIG. 12 is a cross-sectional view taken along line C-C in FIG. 11, illustrating the third embodiment of the LED device according to the disclosure.
Figure 13:
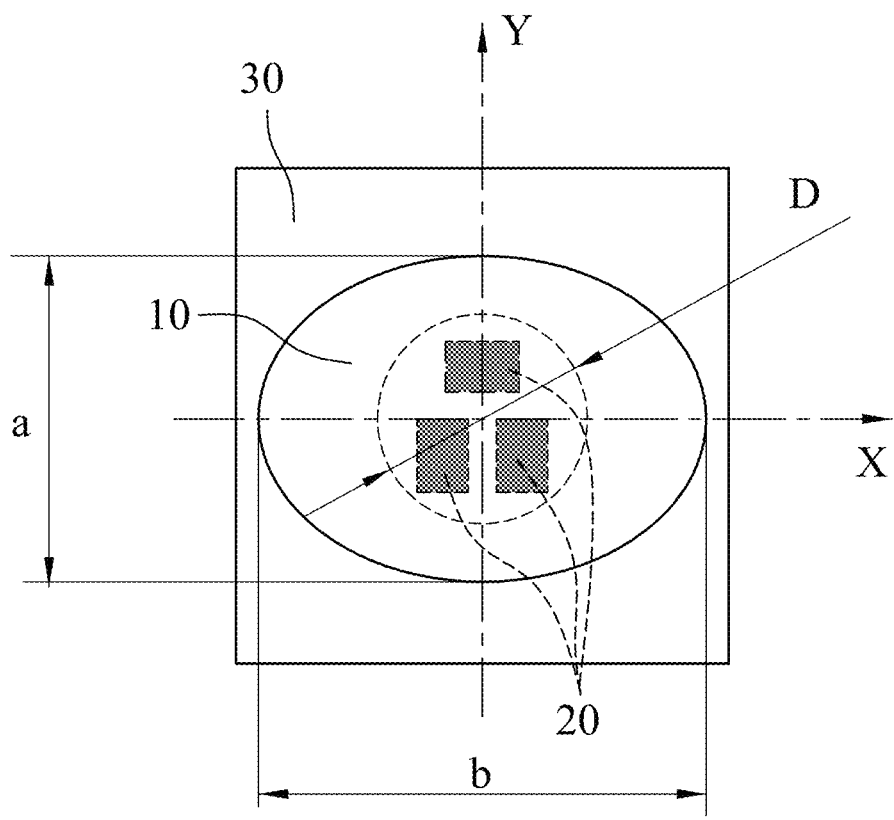
FIG. 13 is a schematic view illustrating relative position of the lens and the encapsulation layer, and a light emitting region of the third embodiment of the LED device according to the disclosure.
Figure 14:
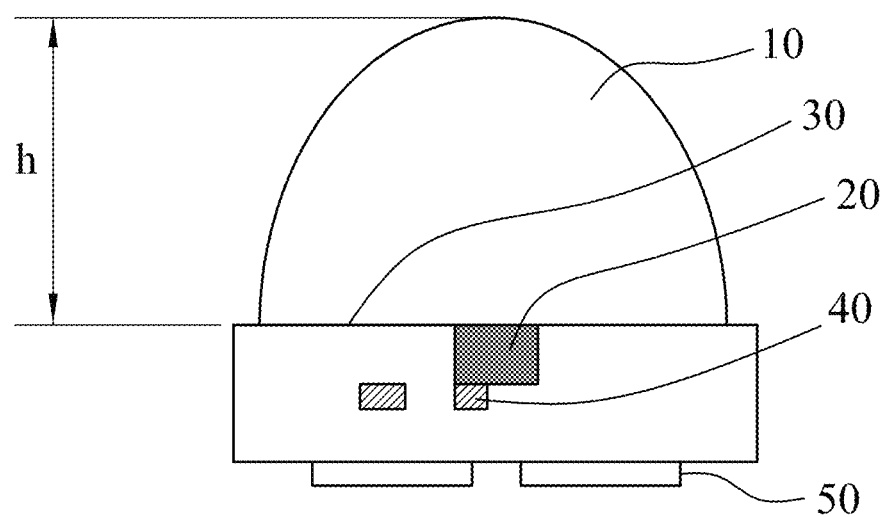
FIG. 14 is a schematic diagram illustrating a height of the lens of the third embodiment of the LED device according to the disclosure.

In a variation of the fourth embodiment, the LED chips 20 of the LED device may be arranged in a triangular pattern as shown in FIGS. 11 and 13.

The LED device according to the disclosure may be applied in a display. The display may include an electrical connecting unit, a case and a screen body that is disposed on the case and that is electrically connected to an external circuit through the electrical connecting unit. The screen body includes the abovementioned LED devices of the disclosure serving as pixels of the screen body. For each of the LED devices, the electrode 50 is welded to and electrically connected to a circuit board of the electrical connecting unit using a soldering paste. As the encapsulation layer 30 of each of the LED device is made of a colored material, disturbance of light emitted from adjacent LED devices may be effectively reduced.

The LED device according to the disclosure may also be applied in a lighting apparatus which includes a frame on which the abovementioned LED devices are assembled. The structure of the lighting apparatus is well-known in this art, and thus the details thereof are omitted herein for sake of brevity.

According to the disclosure, a method for manufacturing the abovementioned LED device is also provided. The method includes the following steps.

In step (a), at least three LED chips 20 are provided. For each of the LED chips 20, the pair of LED electrodes are disposed on the second surface.

In step (b), the LED chips 20 are attached onto an adhesive tape in a spaced apart relationship, such that the second surface of each of the LED chips 20 is disposed away from the adhesive tape.

In step (c), the encapsulation layer 30 is formed to cover the lateral surface of each of the LED chips 20 and to fill gaps between the LED chips 20. A surface of each of the LED electrodes is exposed from the encapsulation layer 30.

The encapsulation layer 30 is formed by solidification of a material that has a transmittance not greater than 30%. The material may include colored silica gel or colored silicone resin.

In step (d), the circuit layer 40 is formed on the exposed surface of each of the LED electrodes and is electrically connected to the LED electrodes of each of the LED chips 20.

Afterward, an insulating layer (not shown in figures) is formed on the circuit layer 40 in such a manner that a portion of the circuit layer 40 is exposed from the insulating layer.

In step (e), the adhesive tape is removed.

In step (f), the lens 10 is formed on the first surface of each of the LED chips 20. The lens 10 may be formed by injection molding of silica gel or resin. Specifically, a lens mold is fixed on the encapsulation layer 30 such that the encapsulation layer 30 and the lens mold cooperatively form a cavity therebetween. A thermosetting silica gel or epoxy resin is then introduced into and fills the cavity, followed by heating to form the lens 10.

In certain embodiments, in between step (e) and (f), the method may further include a step of forming the light-scattering layer 70 on the first surface of each of the LED chips 20. Specifically, a plurality of light-scattering particles are mixed with a light-transmissive silica gel or resin. The resultant mixture is coated onto the encapsulation layer 30 to cover the first surface of each of the LED chips 20, followed by solidification to form the light-scattering layer 70. Then, in the subsequent step (f), the lens mold is fixed on the light-scattering layer 70, and then the silica gel or resin is molded within the cavity formed between the light-scattering layer 70 and the lens mold so as to form the lens 10.

To conclude, by virtue of forming the encapsulation layer 30 that covers the lateral surface of each of the LED chips 20 and that fills gaps between the LED chips 20, the LED chips 20 are directly held in position by the encapsulation layer 30 without need of any die-attach soldering adhesive, and a distance between two immediately adjacent LED chips 20 may be further reduced. Therefore, the LED device of this disclosure can be manufactured in a more efficient and cost-saving manner, and a light emitting angle of each of the LED chips 20 may be controlled to be more consistent.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light emitting diode (LED) device, comprising:
   at least three LED chips that are spaced apart from one another, each of said LED chips being configured to emit light having a respective one of wavelengths, said LED chips cooperating to have a light emitting region, each of said LED chips having a first surface, a second surface opposite to said first surface, and a lateral surface interconnecting said first surface and said second surface;
   an encapsulation layer that covers said lateral surface of each of said LED chips and that fills gaps between said LED chips; and
   a lens that is disposed on said first surface of each of said LED chips and that covers said light emitting region of said LED chips,
   wherein said light emitting region of said LED chips has a diameter not greater than 1 mm, and wherein a contact surface between said lens and said encapsulation layer is in an ellipse shape which satisfies a ratio of A to B ranging from 0.4 to 0.9, A≥1.5D, and H>0.5 A,
   where A represents a length of a minor axis of said ellipse shape, B represents a length of a major axis of said ellipse shape, D represents said diameter of said light emitting region of said LED chips, and H represents a height of said lens.

2. The LED device of claim 1, wherein an amount of light passing through said encapsulation layer accounts for less than 30% of a total amount of light emitted by said LED chips.

3. The LED device of claim 1, wherein said encapsulation layer is made from a material that has a light transmittance not greater than 30%, said material including one of colored silica gel and colored silicone resin.

4. The LED device of claim 1, wherein an optical axis of said lens is coincident with a centroid of said light emitting region.

5. The LED device of claim 1, wherein each of said LED chips has a size that is not greater than 380 μm×380 μm.

6. The LED device of claim 1, wherein two immediately adjacent ones of said LED chips are spaced apart from each other by a distance not greater than 50 μm.

7. The LED device of claim 1, wherein said LED chips are directly held in position by said encapsulation layer.

8. The LED device of claim 1, further comprising an electrode that is disposed on said encapsulation layer opposite to said lens.

9. The LED device of claim 8, further comprising a circuit layer that is disposed adjacent to said second surface of each of said LED chips and that is electrically connected to said electrode.

10. The LED device of claim 9, wherein said electrode is a surface-mount electrode.

11. The LED device of claim 9, wherein said circuit layer is disposed within said encapsulation layer.

12. The LED device of claim 9, further comprising a supporting member that is disposed between said encapsulation layer and said electrode, and that has a via, said circuit layer being electrically connected to said electrode through said via.

13. The LED device of claim 1, further comprising a light-scattering layer that is disposed between said lens and said LED chips.

14. The LED device of claim 13, wherein said light-scattering layer is made from one of light-transmissive silica gel and light-transmissive resin, and includes a plurality of light-scattering particles distributed in said one of light-transmissive silica gel and light-transmissive resin.

15. The LED device of claim 1, wherein said three LED chips are configured to emit red light, green light and blue light, respectively.

16. The LED device of claim 1, wherein said LED chips are arranged in one of a triangular pattern and a straight line.

17. The LED device of claim 1, wherein each of said LED chips includes an LED cathode and an LED anode, said LED device further comprising a lead-out structure that is configured to lead out one of said LED cathode and LED anode for each of said LED chips.

18. A light emitting diode (LED) device, comprising:
   at least three LED chips that are spaced apart from one another, each of said LED chips being configured to emit light having a respective one of wavelengths, said LED chips cooperating to have a light emitting region, each of said LED chips having a first surface, a second surface opposite to said first surface, and a lateral surface interconnecting said first surface and said second surface;

an encapsulation layer that covers said lateral surface of each of said LED chips and that fills gaps between said LED chips; and a lens that is disposed on said first surface of each of said LED chips and that covers said light emitting region of said LED chips, wherein said lens is in a semi-ellipsoid shape, and a contact surface between said lens and said encapsulation layer is in an ellipse shape which has a minor axis and a major axis, a half-value angle in a direction along said minor axis is a, and a half-value angle in a direction along said major axis is $\beta$, wherein $\alpha<\beta$, and $20°\leq\alpha\leq70°$.

19. A display, comprising at least one LED device as claimed in claim 18.

* * * * *